US012701656B2

(12) United States Patent
Jang et al.

(10) Patent No.: US 12,701,656 B2
(45) Date of Patent: Aug. 4, 2026

(54) PRINTED CIRCUIT BOARD, MANUFACTURING METHOD THEREOF, AND BATTERY PACK INCLUDING THE SAME

(71) Applicant: LG Energy Solution, Ltd., Seoul (KR)

(72) Inventors: Jae Young Jang, Daejeon (KR); Jin Hyun Lee, Daejeon (KR); Min Su Son, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 205 days.

(21) Appl. No.: 18/690,029

(22) PCT Filed: Sep. 22, 2022

(86) PCT No.: PCT/KR2022/014178
§ 371 (c)(1),
(2) Date: Mar. 7, 2024

(87) PCT Pub. No.: WO2023/063612
PCT Pub. Date: Apr. 20, 2023

(65) Prior Publication Data
US 2024/0397616 A1 Nov. 28, 2024

(30) Foreign Application Priority Data
Oct. 12, 2021 (KR) ........................ 10-2021-0134806

(51) Int. Cl.
H05K 1/09 (2006.01)
H01M 10/42 (2006.01)
H01M 50/284 (2021.01)

(52) U.S. Cl.
CPC ............ H05K 1/09 (2013.01); H01M 10/425 (2013.01); H01M 50/284 (2021.01);
(Continued)

(58) Field of Classification Search
CPC ...... H05K 1/09; H05K 3/4084; H05K 3/4015; H05K 3/328; H05K 3/28;
(Continued)

(56) References Cited

U.S. PATENT DOCUMENTS 6,612,025 B1 * 9/2003 Shi ........................ H05K 3/445
174/250
6,655,967 B2 12/2003 Oda
(Continued)

FOREIGN PATENT DOCUMENTS

CN 112135427 A 12/2020
DE 19522338 A1 1/1997
(Continued)

OTHER PUBLICATIONS

International Search Report for Application No. PCT/KR2022/014178 mailed Jan. 2, 2023, pp. 1-3.
(Continued)

*Primary Examiner* — Roshn K Varghese
(74) *Attorney, Agent, or Firm* — Lerner David LLP

(57) ABSTRACT
A printed circuit board includes an inner layer; a first insulating layer formed on an upper part of the inner layer; a first copper foil layer formed on an upper part of the first insulating layer; and a solder resist layer formed on an upper part of the first copper foil layer. When welding a metal tab onto the solder resist layer, a welding portion that couples the metal tab and the first copper foil layer is formed, and a gap is formed at a portion adjacent to the welding portion.

18 Claims, 4 Drawing Sheets

(52) U.S. Cl.
CPC ............... *H01M 2010/4271* (2013.01); *H05K 2201/0355* (2013.01); *H05K 2201/10037* (2013.01); *H05K 2201/2081* (2013.01)

(58) Field of Classification Search
CPC . H05K 2201/0355; H05K 2201/10037; H05K 2201/2081; H05K 2201/0382; H05K 2201/0394; H05K 2201/091; H05K 2201/1028; H05K 2201/1031; H05K 2201/10946; H05K 2203/1189; H05K 2201/0397; B23K 26/21; B23K 26/22; H01M 50/54; H01M 50/516; H01M 50/284; H01M 10/425; H01M 2010/4271; H01R 43/0221; Y02R 60/10; H10W 72/077
See application file for complete search history.

(56) References Cited

U.S. PATENT DOCUMENTS

| | | | |
|---|---|---|---|
| 2004/0048132 A1 | 3/2004 | Takai et al. | |
| 2007/0111557 A1* | 5/2007 | Higashiguchi | ........ H01M 10/42 |
| | | | 439/66 |
| 2009/0084589 A1 | 4/2009 | Tan | |
| 2012/0121954 A1* | 5/2012 | Harima | ............... H01M 50/152 |
| | | | 429/185 |
| 2020/0009685 A1* | 1/2020 | Kumazawa | ......... H01M 50/522 |
| 2022/0183154 A1 | 6/2022 | Fukao et al. | |

FOREIGN PATENT DOCUMENTS

| | | | |
|---|---|---|---|
| DE | 102018219037 A1 | 5/2020 | |
| EP | 2755456 A1 | 7/2014 | |
| JP | 2003272662 A | 9/2003 | |
| JP | 2014135166 A | 7/2014 | |
| KR | 100670594 B1 | 1/2007 | |
| KR | 20090101404 A | 9/2009 | |
| KR | 101053048 B1 | 8/2011 | |
| KR | 101103301 B1 | 1/2012 | |
| KR | 20120134265 A | 12/2012 | |
| KR | 20130046388 A | 5/2013 | |
| KR | 20150122409 A | 11/2015 | |
| KR | 20190046511 A | 5/2019 | |
| KR | 102221777 B1 | 3/2021 | |
| WO | 99/49708 A1 | 9/1999 | |
| WO | 2020196790 A1 | 10/2020 | |

OTHER PUBLICATIONS

Communication pursuant to Article 94(3) EPC for European Application No. 22881241.8, dated Jun. 3, 2025, 6 pages.
Extended European Search Report including Search Opinion from EP Appl. No. 22881241.8, dated Oct. 31, 2024, pp. 1-9.

* cited by examiner

【FIG. 1】
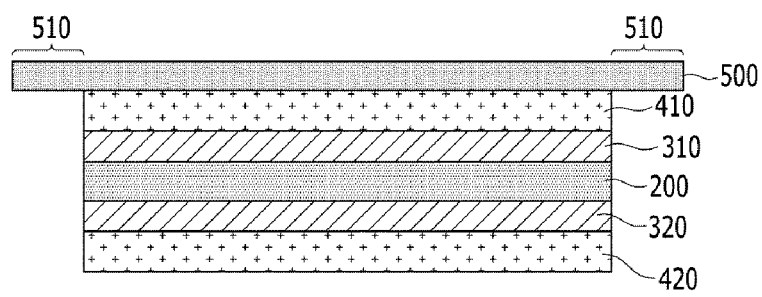
【FIG. 2】
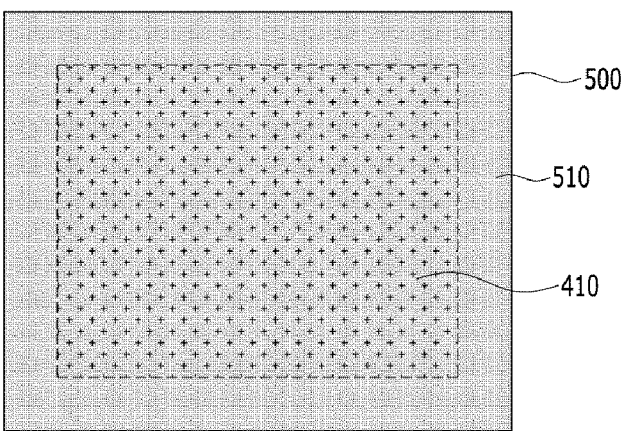
【FIG. 3】
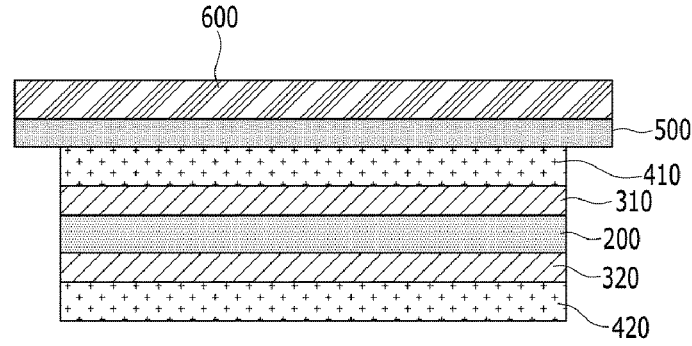

【FIG. 4】
100
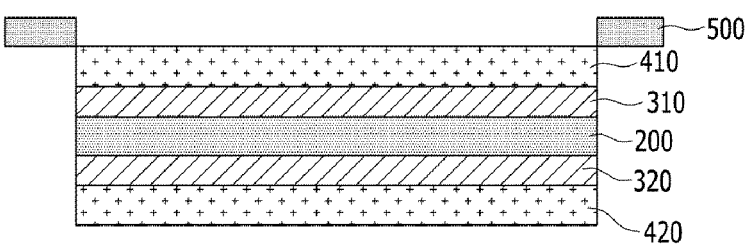
【FIG. 5】
100
【FIG. 6】
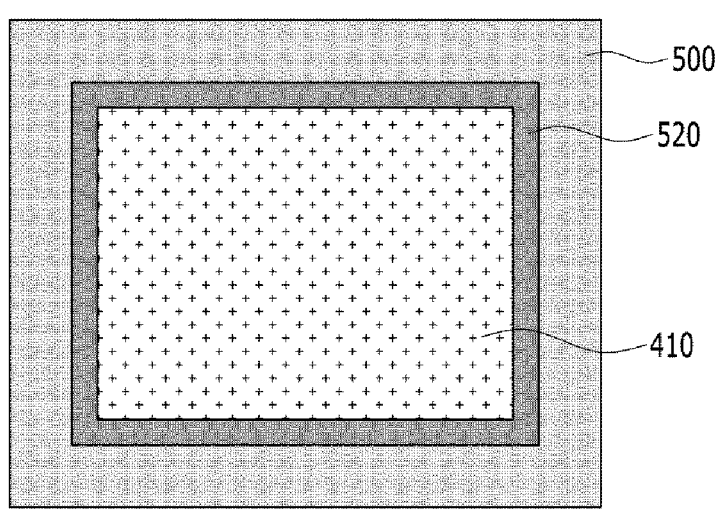

【FIG. 7】
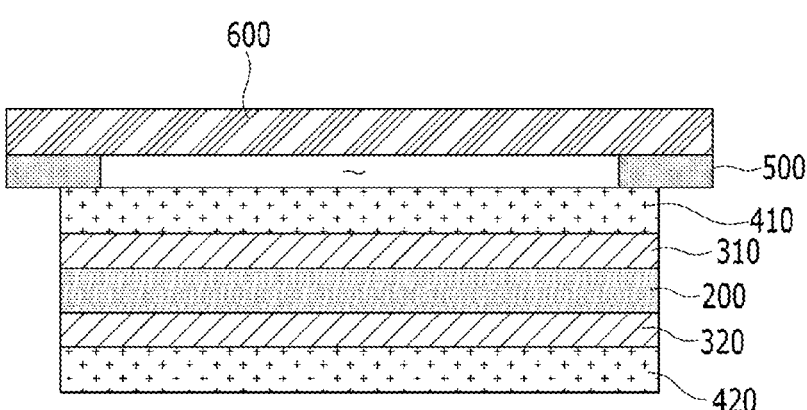

[FIG. 8]
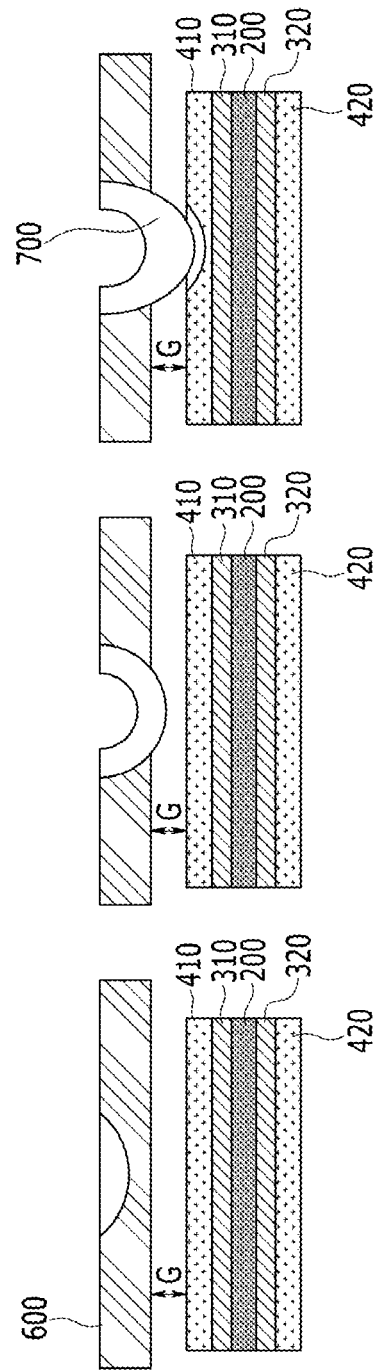

PRINTED CIRCUIT BOARD, MANUFACTURING METHOD THEREOF, AND BATTERY PACK INCLUDING THE SAME

CROSS-REFERENCE TO RELATED APPLICATIONS

The present application is a national phase entry under 35 U.S.C. § 371 of International Application No. PCT/KR2022/014178, filed on Sep. 22, 2022, which claims priority from Korean Patent Application No. 10-2021-0134806, filed on Oct. 12, 2021, all of which are incorporated herein by reference.

TECHNICAL FIELD

The present disclosure relates to a printed circuit board and a battery pack including the same, and more particularly, to a printed circuit board having excellent durability and a battery pack including the same.

BACKGROUND

In modern society, as portable devices such as a mobile phone, a notebook computer, a camcorder and a digital camera has been daily used, the development of technologies in the fields related to mobile devices as described above has been activated. In addition, a chargeable/dischargeable secondary battery is used as a power source for an electric vehicle (EV), a hybrid electric vehicle (HEV), a plug-in hybrid electric vehicle (P-HEV) and the like, as a part of a method of solving air pollution and the like caused by existing gasoline vehicles using fossil fuel. Therefore, the need for developing the secondary battery has been increasing.

Currently commercialized secondary batteries include a nickel cadmium battery, a nickel hydrogen battery, a nickel zinc battery, and a lithium secondary battery. Among them, the lithium secondary battery has come into the spotlight because they have advantages, for example, hardly exhibiting memory effects compared to nickel-based secondary batteries and thus being freely charged and discharged, and having very low self-discharge rate and high energy density.

Such lithium secondary battery mainly uses a lithium-based oxide and a carbonaceous material as a cathode active material and an anode active material, respectively. The lithium secondary battery includes an electrode assembly in which a cathode plate and an anode plate, each being coated with the cathode active material and the anode active material, are arranged with a separator being interposed between them, and a battery case which seals and houses the electrode assembly together with an electrolytic solution.

Generally, the lithium secondary battery may be classified based on the shape of the exterior material into a can-type secondary battery in which the electrode assembly is built into a metal can, and a pouch-type secondary battery in which the electrode assembly is built into a pouch of an aluminum laminate sheet.

In the case of a secondary battery used for small-sized devices, two to three battery cells are arranged, but in the case of a secondary battery used for a middle or large-sized device such as an automobile, a battery module in which a large number of battery cells are electrically connected is used. In such a battery module, a large number of battery cells are connected to each other in series or parallel to form a cell assembly, thereby improving capacity and output. One or more battery modules can be mounted together with various control and protection systems such as a BMS (Battery Management System) and a cooling system to form a battery pack.

At this time, in the case of a printed circuit board (PCB) that is used as a constituent element of a battery pack's BMS and the like, it generally includes an inner layer, and an insulating layer and a copper foil layer stacked on the upper and lower parts on the basis of the inner layer. Wherein, when performing welding for connecting the metal tab on the printed circuit board, there was a risk that the inner layers of the printed circuit board will be damaged by welding.

In particular, when the inner layer of the printed circuit board is damaged, damage to the inner layer pattern occurs, whereby not only it is difficult to perform the functions of the printed circuit board, but also there is a high possibility that the insulating layer will be destroyed and disconnection will occur.

Therefore, when welding the metal tab onto the printed circuit board, there is a need for a structure that can prevent damage to the inner layer of the printed circuit board.

SUMMARY

Technical Problem

It is an object of the present disclosure to provide a printed circuit board that can prevent damage to the inner layer that occurs during welding, and a battery pack including the same.

However, the objects of the present disclosure are not limited to the aforementioned objects, and other objects which are not mentioned herein should be clearly understood by those skilled in the art from the following detailed description and the accompanying drawings.

Technical Solution

According to an aspect of the present disclosure, there is provided a printed circuit board comprising: an inner layer; a first insulating layer formed on an upper part of the inner layer; a first copper foil layer formed on an upper part of the first insulating layer; and a solder resist layer formed on an upper part of the first copper foil layer, wherein when welding a metal tab onto the solder resist layer, a welding portion that couples the metal tab and the first copper foil layer is formed, and a gap is formed at a portion adjacent to the welding portion.

The gap may space the metal tab and the first copper foil layer apart from each other.

When welding the metal tab, a part or all of the solder resist layer may be removed to form the gap.

The gap may be between 50 $\mu m$ and 200 $\mu m$.

The solder resist layer may cover an entire surface of the first copper foil layer.

The solder resist layer may cover a part of the first copper foil layer.

The solder resist layer may cover an outer edge part of the first copper foil layer.

An outer size of the solder resist layer may be formed to be larger than an outer size of the first copper foil layer.

A size of the solder resist layer may be formed to be smaller than or equal to a size of the metal tab.

A size of the first copper foil layer may be formed to be smaller than a size of the metal tab.

The metal tab may be connected to the first copper foil layer via the welding.

According to another aspect of the present disclosure, there is provided a manufacturing method of a printed circuit board, the method comprising the steps of: forming an inner layer, a first insulating layer formed on an upper part of the inner layer, and a first copper foil layer formed on an upper part of the first insulating layer; and forming a solder resist layer on an upper part of the first copper foil layer, wherein when welding a metal tab onto the solder resist layer, a welding portion that couples the metal tab and the first copper foil layer is formed, and a gap is formed at a portion adjacent to the welding portion.

According to yet another aspect of the present disclosure, there is provided a battery pack comprising the above-mentioned printed circuit board.

Advantageous Effects

A printed circuit board according to the present disclosure includes a solder resist layer present on the copper foil layer, and thus can prevent damage to the inner layer of the printed circuit board when welding the metal tab.

The effects of the present disclosure are not limited to the effects mentioned above and additional other effects not described above will be clearly understood from the description of the appended claims by those skilled in the art.

BRIEF DESCRIPTION OF THE DRAWINGS

FIG. 1 is a cross-sectional view showing the structure of a printed circuit board according to an embodiment of the present disclosure;

FIG. 2 is a plan view of the printed circuit board of FIG. 1 as viewed from above;

FIG. 3 is a cross-sectional view showing the structure before a metal tab is welded onto the printed circuit board of FIG. 1;

FIG. 4 is a cross-sectional view showing the structure of a printed circuit board according to another embodiment of the present disclosure;

FIG. 5 is a cross-sectional view showing the structure of a printed circuit board in which the printed circuit board of FIG. 4 is partially deformed;

FIG. 6 is a plan view of the printed circuit board of FIG. 5 as viewed from above;

FIG. 7 is a cross-sectional view showing the structure before a metal tab is welded onto the printed circuit board of FIG. 5; and FIG. 8 is a cross-sectional view showing the structure of a printed circuit board in the process of welding a metal tab.

DETAILED DESCRIPTION

Hereinafter, various embodiments of the present disclosure will be described in detail with reference to the accompanying drawings so that those skilled in the art can easily carry out them. The present disclosure may be modified in various different ways, and is not limited to the embodiments set forth herein.

Portions that are irrelevant to the description will be omitted to clearly describe the present disclosure, and like reference numerals designate like elements throughout the description.

Further, in the drawings, the size and thickness of each element are arbitrarily illustrated for convenience of description, and the present disclosure is not necessarily limited to those illustrated in the drawings. In the drawings, the thickness of layers, regions, etc. are exaggerated for clarity.

In the drawings, for convenience of description, the thicknesses of some layers and regions are exaggerated.

In addition, it will be understood that when an element such as a layer, film, region, or plate is referred to as being "on" or "above" another element, it can be directly on the other element or intervening elements may also be present. In contrast, when an element is referred to as being "directly on" another element, it means that other intervening elements are not present. Further, the word "on" or "above" means disposed on or below a reference portion, and does not necessarily mean being disposed on the upper end of the reference portion toward the opposite direction of gravity.

Further, throughout the description, when a portion is referred to as "including" or "comprising" a certain component, it means that the portion can further include other components, without excluding the other components, unless otherwise stated.

Further, throughout the description, when referred to as "planar", it means when a target portion is viewed from the upper side, and when referred to as "cross-sectional", it means when a target portion is viewed from the side of a cross section cut vertically.

The terms "first," "second," etc. are used herein to explain various components, but the components should not be limited by the terms. These terms are only used to distinguish one component from the other component.

Now, a printed circuit board according to one embodiment of the present disclosure will be described with reference to FIGS. 1 to 3, and FIG. 8.

FIG. 1 is a cross-sectional view showing the structure of a printed circuit board according to an embodiment of the present disclosure. FIG. 2 is a plan view of the printed circuit board of FIG. 1 as viewed from above. FIG. 3 is a cross-sectional view showing the structure before a metal tab is welded onto the printed circuit board of FIG. 1. FIG. 8 is a cross-sectional view showing the structure of a printed circuit board in the process of welding a metal tab.

Referring to FIG. 1, a printed circuit board (PCB) 100 according to the present embodiment includes an inner layer 200; a first insulating layer 310 formed on an upper part of the inner layer 200; and a second insulating layer 320 formed on a lower part of the inner layer 200. Also, the printed circuit board 100 includes a first copper foil layer 410 formed on an upper part of the first insulating layer 310, a second copper foil layer 420 formed on a lower part of the second insulating layer 320, and a solder resist layer 500 formed on an upper part of the first copper foil layer 410.

At this time, the inner layer 200 may be a paper core layer impregnated with epoxy resin or a glass fiber layer impregnated with epoxy resin, and more specifically, it may be FR-4 (i.e., Flame Retardant-4). Also, the first insulating layer 310 and the second insulating layer 320 may be formed of the same material, and the material may be prepreg (PPG, Pre Preg). The solder resist layer 500 according to the present embodiment may be specifically a photo solder resist (PSR) layer.

Conventionally, there was a risk of damaging the inner layer of a printed circuit board when welding with a metal tab. When the inner layer is damaged, not only the pattern of the inner layer is damaged but also the insulating layer is destroyed, which caused a problem that the occurrence of disconnection increases.

Therefore, referring to FIG. 8, the printed circuit board 100 according to the present embodiment is configured such that when welding the metal tab 600 onto the solder resist layer 500, a welding portion 700 that couples the metal tab 600 and the first copper foil layer 410 is formed, and a gap G is formed at a portion adjacent to the welding portion 700. At this time, the metal tab 600 may be a copper tab or a nickel tab, and specifically may be a nickel tab, but is not limited thereto.

Looking more closely at FIG. 8, although the solder resist layer 500 is not shown in FIG. 8, a gap G formed between the metal tab 600 and the first copper foil layer 410 may match or correspond to the thickness of the solder resist layer 500.

The gap G may space the metal tab 600 and the first copper foil layer 410 apart from each other, and particularly, the gap G can be formed on both sides of the welding portion 700 to secure a spaced distance between the metal tab 600 and the first copper foil layer 410.

When the metal tab 600 is welded onto the printed circuit board 100 in order to form the gap G, a part or all of the solder resist layer 500 may be removed. This is for removing the solder resist layer 500 by the heat generated by welding, and even if a part or all of the solder resist layer 500 is removed, a part of the metal tab 600 is connected to the first copper foil layer 410 by the welding, so that a metal tab 600 can be welded onto the printed circuit board 100. At this time, the gap G increases the distance between the metal tab 600 and the inner layer 200, which prevents a part of the molten metal tab 600 from reaching the inner layer 200 even if the metal tab 600 is welded, thereby capable of preventing damage to the inner layer 200. Therefore, when welding the metal tab 600, a part or all of the solder resist layer 500 can be removed to form a gap G between the metal tab 600 and the first copper foil layer 410. At this time, even if the gap G is formed, the metal tab 600 may be connected to the first copper foil layer 410 via the welding, and particularly, the metal tab 600 and the first copper foil layer 410 may be connected via the welding portion 700.

The thickness of the solder resist layer 500 according to the present embodiment may be between 50 μm and 200 μm, preferably between 75 μm and 150 μm, and more preferably between 80 μm and 100 μm.

Therefore, the gap G may also be formed in a range of 50 μm to 200 μm, preferably in a range of 75 μm to 150 μm, and more preferably in a range of 80 μm to 100 μm.

Meanwhile, the solder resist layer 500 may cover the entire surface of the first copper foil layer 410. Referring to FIG. 2, the front surface of the first copper foil layer 410 may mean the whole surface of the first copper foil layer 410 as viewed from above. Therefore, as shown in FIG. 2, the solder resist layer 500 may cover the entire surface of the first copper foil layer 410. At this time, the size of the solder resist layer 500 may be equal to or greater than the size of the first copper foil layer 410. Therefore, when the size of the solder resist layer 500 is larger than the size of the first copper foil layer 410, an outer surface 510 of the solder resist layer may be formed. The outer surface 510 of the solder resist layer may allow the metal tab 600 to be stably formed and welded onto the printed circuit board 100 and the solder resist layer 500.

Referring to FIG. 3, the size of the solder resist layer 500 may be formed to be smaller than or equal to the size of the metal tab 600. The size of the first copper foil layer 410 may be formed to be smaller than that of the metal tab 600. By forming to the above size, it is possible to ensure welding stability between the metal tab 600 and the printed circuit board 100.

Next, a printed circuit board according to another embodiment of the present disclosure will be described with reference to FIGS. 4 to 8. Since there are redundant contents that overlap with those described above, only the portions that differ from the contents described above will be described.

FIG. 4 is a cross-sectional view showing the structure of a printed circuit board according to another embodiment of the present disclosure. FIG. 5 is a cross-sectional view showing the structure of a printed circuit board in which the printed circuit board of FIG. 4 is partially deformed. FIG. 6 is a plan view of the printed circuit board of FIG. 5 as viewed from above. FIG. 7 is a cross-sectional view showing the structure before a metal tab is welded onto the printed circuit board of FIG. 5.

Referring to FIGS. 4 to 6, the solder resist layer 500 of the printed circuit board according to the present embodiment may cover a part of the first copper foil layer 410. In particular, the solder resist layer 500 may cover an outer edge part of the first copper foil layer 410. Further, an edge part 520 inside the solder resist layer may be formed as the portion on the solder resist layer 500 at the position where the solder resist layer 500 and the outer edge part of the first copper foil layer 410 overlap.

More specifically, referring to FIG. 4, the solder resist layer 500 may be formed so that there is no portion overlapping the first copper foil layer 410. Also, referring to FIG. 5, a portion where the solder resist layer 500 and the first copper foil layer 410 overlap can be formed so that an edge part 520 inside the solder resist layer is formed. Therefore, the solder resist layer 500 can be stably formed onto the first copper foil layer 410 by the edge part 520 inside the solder resist layer. Further, as shown in FIG. 7, a metal tab 600 may be formed on an upper part of the solder resist layer 500.

As described above, in order for the solder resist layer 500 to cover the outer edge part of the first copper foil layer 410, the outer size of the solder resist layer 500 may be formed to be larger than the outer size of the first copper foil layer 410, or the outer size of the solder resist layer 500 may be formed to be equal to the outer size of the first copper foil layer 410. At this time, the outer size may mean the outer size of the solder resist layer 500 and the first copper foil layer 410 shown in FIG. 6. In addition, the inner size of the solder resist layer 500 may be formed to be smaller than the outer size of the first copper foil layer 410.

By forming to the above size, as shown in FIG. 8, the metal tab 600 can be stably formed on the solder resist layer 500, and when the welding is performed, a gap G can be formed to prevent damage to the inner layer.

Next, a manufacturing method of a printed circuit board according to another embodiment of the present disclosure will be described. All of the contents concerning the printed circuit board described above can be applied to the manufacturing method of the printed circuit board according to the present embodiment, and since there are redundant contents that overlap with those described above, only the portions that differ from the contents described above will be described.

The manufacturing method of the printed circuit board according to the present embodiment includes a step (S100) of forming an inner layer 200, a first insulating layer 310 formed on an upper part of the inner layer 200, and a first copper foil layer 410 formed on an upper part of the first insulating layer 310; and a step (S200) of forming a solder resist layer 500 on an upper part of the first copper foil layer 410, wherein when welding a metal tab 600 onto the solder resist layer 500, a welding portion 700 that couples the metal tab 600 and the first copper foil layer 410 is formed, and a gap G is formed at a portion adjacent to the welding portion 700. In addition, the gap G may be formed on both side surfaces on the basis of the welding portion 700.

In addition, in the manufacturing method of the printed circuit board according to the present embodiment, the step (S100) of forming an inner layer 200, a first insulating layer 310 formed on an upper part of the inner layer 200, and a first copper foil layer 410 formed on an upper part of the first insulating layer 310 may further comprise forming a second insulating layer 320 formed in a lower part of the inner layer 200 and a second copper foil layer 420 formed in a lower part of the second insulating layer 320.

Looking more closely at FIG. 8, although the solder resist layer 500 is not shown in FIG. 8, the gap G formed between the metal tab 600 and the first copper foil layer 410 may match or correspond to the thickness of the solder resist layer 500.

The gap G may space the metal tab 600 and the first copper foil layer 410 apart from each other, and particularly, the gap G may be formed on both sides of the welding portion 700 to secure a spaced distance between the metal tab 600 and the first copper foil layer 410.

At this time, the thickness of the solder resist layer 500 may be between 50 μm and 200 μm, preferably between 75 μm and 150 μm, and more preferably between 80 μm and 100 μm.

Therefore, the gap G may also be formed in a range of 50 μm to 200 μm, preferably in a range of 75 μm to 150 μm, and more preferably in a range of 80 μm to 100 μm.

When the metal tab 600 is welded onto the printed circuit board 100 in order to form the gap G, a part or all of the solder resist layer 500 may be removed. This is for removing the solder resist layer 500 by the heat generated by welding, and even if a part or all of the solder resist layer 500 is removed, a part of the metal tab 600 is connected to the first copper foil layer 410 by the welding, so that a metal tab 600 can be welded onto the printed circuit board 100. At this time, the gap G increases the distance between the metal tab 600 and the inner layer 200, which prevents a part of the molten metal tab 600 from reaching the inner layer 200 even if the metal tab 600 is welded, thereby capable of preventing damage to the inner layer 200.

Therefore, when the metal tab 600 is welded, a part or all of the solder resist layer 500 can be removed to form a gap G between the metal tab 600 and the first copper foil layer 410. At this time, even if the gap G is formed, the metal tab 600 may be connected to the first copper foil layer 410 via the welding, and particularly, the metal tab 600 and the first copper foil layer 410 may be connected via the welding portion 700.

Meanwhile, the solder resist layer 500 may cover the entire surface of the first copper foil layer 410. Also, the solder resist layer 500 may cover a part of the first copper foil layer 410. In particular, the solder resist layer 500 may cover the outer edge part of the first copper foil layer 410. Further, an edge part 520 inside the solder resist layer may be formed as the portion on the solder resist layer 500 at the position where the solder resist layer 500 and the outer edge part of the first copper foil layer 410 overlap.

By manufacturing the printed circuit board by the method as described above, it is possible to prevent damage to the inner layer of the printed circuit board during welding of the metal tab.

A battery pack according to another embodiment of the present disclosure will be described below.

The battery pack according to the present embodiment includes the above-mentioned printed circuit board. In addition, the battery pack of the present disclosure may have a structure in which one or more of the battery modules according to the present embodiment are gathered, and packed together with a battery management system (BMS) and a cooling device that control and manage battery's temperature, voltage, etc. Therefore, the printed circuit board can be used as a part of the constituent elements of the battery management system (BMS).

Further, the battery pack can be applied to various devices. Such a device can be applied to a vehicle means such as an electric bicycle, an electric vehicle, or a hybrid vehicle, but the present disclosure is not limited thereto, and is applicable to various devices that can use a battery module, which is also falls under the scope of the present disclosure.

Although preferred embodiments of the present disclosure have been described in detail above, the scope of the present disclosure is not limited thereto, and numerous other modifications can be carried out by those skilled in the art, without departing from the spirit and scope of the principles of the invention described in the appended claims. Further, these modifications should not be understood individually from the technical spirit or perspective of the present disclosure.

DESCRIPTION OF REFERENCE NUMERALS

100: printed circuit board
200: inner layer
310: first insulating layer
410: first copper foil layer
500: solder resist layer
600: metal tab
700: welding portion

The invention claimed is:

1. A printed circuit board comprising:
an inner layer;
a first insulating layer disposed on an upper part of the inner layer;
a first copper foil layer disposed on an upper part of the first insulating layer;
a solder resist layer disposed on an upper part of the first copper foil layer and defining a gap extending from an upper surface of the solder resist layer to a lower surface of the solder resist layer; and
a metal tab disposed on the upper surface of the solder resist layer,
wherein the metal tab includes a welding portion that extends from the upper surface of the solder resist layer through the gap so as to electrically couples the metal tab and the first copper foil layer.

2. The printed circuit board according to claim 1, wherein:
the gap is defined by a distance that the metal tab and the first copper foil layer are spaced apart from each other.

3. The printed circuit board according to claim 1, wherein:
a part of the solder resist layer or all of the solder resist layer is configured to be removed during the welding, so as to form the gap.

4. The printed circuit board according to claim 1, wherein:
the gap is in a range of 50 μm to 200 μm.

5. The printed circuit board according to claim 1, wherein:
the solder resist layer covers an entire surface of the first copper foil layer.

6. The printed circuit board according to claim 1, wherein:
the solder resist layer covers a part of the first copper foil layer.

7. The printed circuit board according to claim 6, wherein:
the solder resist layer covers an outer edge part of the first copper foil layer.

8. The printed circuit board according to claim 7, wherein:

an outer perimeter of the solder resist layer is larger than an outer perimeter of the first copper foil layer.

9. The printed circuit board according to claim 1, wherein:

an area of the solder resist layer is smaller than or equal to an area of the metal tab.

10. The printed circuit board according to claim 1, wherein:

an area of the first copper foil layer is smaller than an area of the metal tab.

11. A battery pack comprising the printed circuit board as set forth in claim 1.

12. A manufacturing method of a printed circuit board, the method comprising the steps of:

disposing a first insulating layer on an upper part of an inner layer;

disposing a first copper foil layer on an upper part of the first insulating layer;

disposing a solder resist layer on an upper part of the first copper foil layer; and welding a metal tab of the solder resist layer such that a welding portion of the metal tab extends from an upper part of the solder resist layer through a gap defined as an opening between the upper part of the solder resist layer and a lower part of the solder resist layer, wherein the welding portion electrically couples the metal tab and the first copper foil layer.

13. The manufacturing method of a printed circuit board according to claim 12, wherein:

the gap is defined by a distance that the metal tab and the first copper foil layer are spaced apart from each other.

14. The manufacturing method of a printed circuit board according to claim 12, wherein:

in the welding of the metal tab, a part of the solder resist layer or all of the solder resist layer is removed to form the gap.

15. The manufacturing method of a printed circuit board according to claim 12, wherein:

the gap is in a range of 50 μm to 200 μm.

16. The manufacturing method of a printed circuit board according to claim 12, wherein:

the solder resist layer covers an entire surface of the first copper foil layer.

17. The manufacturing method of a printed circuit board according to claim 12, wherein:

the solder resist layer covers a part of the first copper foil layer.

18. The manufacturing method of a printed circuit board according to claim 17, wherein:

the solder resist layer covers an outer edge part of the first copper foil layer.

* * * * *